(12) United States Patent
Lin et al.

(10) Patent No.: US 11,257,807 B2
(45) Date of Patent: *Feb. 22, 2022

(54) SEMICONDUCTOR DEVICE OF ELECTROSTATIC DISCHARGE PROTECTION

(71) Applicant: United Microelectronics Corp., Hsinchu (TW)

(72) Inventors: Ting-Yao Lin, Hsinchu County (TW); Chun Chiang, Hsinchu (TW); Ping-Chen Chang, Pingtung County (TW); Tien-Hao Tang, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/111,220

(22) Filed: Dec. 3, 2020

(65) Prior Publication Data
US 2021/0091069 A1  Mar. 25, 2021

Related U.S. Application Data

(63) Continuation of application No. 16/394,967, filed on Apr. 25, 2019, now Pat. No. 10,903,205.

(51) Int. Cl.
*H01L 27/02* (2006.01)
*H01L 29/66* (2006.01)
*H01L 29/74* (2006.01)

(52) U.S. Cl.
CPC .... *H01L 27/0262* (2013.01); *H01L 29/66371* (2013.01); *H01L 29/7408* (2013.01)

(58) Field of Classification Search
CPC ... H01L 27/02; H01L 27/026; H01L 27/0262; H01L 29/66; H01L 29/663; H01L 29/6637; H01L 29/66371; H01L 29/74; H01L 29/74; H01L 29/7408
USPC ............................................. 257/154
See application file for complete search history.

(56) References Cited

U.S. PATENT DOCUMENTS

| | | |
|---|---|---|
| 5,728,612 A | 3/1998 | Wei et al. |
| 5,959,332 A | 9/1999 | Ravanelli et al. |
| 6,765,771 B2 | 7/2004 | Ker et al. |
| 7,053,452 B2 | 5/2006 | Sang |
| 7,176,539 B2 | 2/2007 | Chen |
| 7,368,761 B1 | 5/2008 | Lai et al. |
| 7,514,766 B2 | 4/2009 | Yoshida |
| 7,582,916 B2 | 9/2009 | Ker et al. |
| 7,910,998 B2 | 3/2011 | Hwang et al. |
| 8,299,533 B2 | 10/2012 | Campi, Jr. et al. |

(Continued)

*Primary Examiner* — Monica D Harrison
(74) *Attorney, Agent, or Firm* — J.C. Patents

(57) ABSTRACT

A semiconductor device of electrostatic discharge (ESD) protection is provided, including a deep N-type region, disposed in a substrate; a deep P-type region, disposed in the substrate; a first P-type well, disposed in the deep N-type region; a first N-type well, abutting to the first P-type well, disposed in the deep N-type region. Further, a second P-type well abutting to the first N-type well is disposed in the deep P-type region. A second N-type well abutting to the second P-type well is disposed in the deep P-type region. A side N-type well is disposed in the deep N-type region at an outer side of the first P-type well. A side P-type well is disposed in the deep P-type region at an outer side of the second N-type well.

8 Claims, 3 Drawing Sheets

(56) References Cited

U.S. PATENT DOCUMENTS 9,842,838 B2    12/2017   Chapman et al.
10,903,205 B2 *   1/2021   Lin ..................... H01L 29/7408

* cited by examiner

SEMICONDUCTOR DEVICE OF ELECTROSTATIC DISCHARGE PROTECTION

CROSS REFERENCE TO RELATED APPLICATION

This application is a continuation application of and claims the priority benefit of U.S. application Ser. No. 16/394,967, filed on Apr. 25, 2019, now allowed. The entirety of the above-mentioned patent application is hereby incorporated by reference herein and made a part of specification.

BACKGROUND

1. Field of the Invention

The present invention generally relates to semiconductor fabrication technology, and particularly to semiconductor device of electrostatic discharge (ESD) protection and the method to fabricate the ESD device. The ESD device is based on silicon-controlled rectifier (SCR) mechanism.

2. Description of Related Art

As usually known, the electrostatic discharge in an example is a phenomenon caused by the movement of static electricity from the surface of a non-conductive object. A human walking over a carpet may generate several hundred to several thousand volts of static electricity even if the ambient relative humidity (RH) is high. More than ten thousand volts may be produced if the surrounding relativity humidity is low. A typical station for packaging or testing semiconductor devices may be charged from several hundred up to several thousand volts of static electricity in an unscreened environment. Therefore, when the aforementioned charged body (a human body or a station) is in contact with a wafer, static electricity may discharge through the wafer in an electrostatic discharge. The sudden surge in power during the electrostatic discharge is often a main cause for the damage of semiconductor devices on the wafer.

Under developing for the ESD device, the ESD device may be designed based on SCR structure. The SCR device in semiconductor structure in an example is based on a path of PNPN, in which P and N respectively represent the P-type semiconductor part and N-type semiconductor part.

The ESD device is designed such that the ESD device is not triggered when the normal operation voltage but is triggered when the high voltage caused by the ESD event is received at the protected terminal.

Various ways have been proposed to design the ESD device but the ESD device is still under developing to adapt various electronic circuits to be protected from ESD with better performance.

SUMMARY OF THE INVENTION

The invention provides a semiconductor device of ESD, which may be formed based on the PNPN structure but the trigger voltage at the protected terminal may be detected so as to at least trigger the ESD device with better condition.

In an embodiment, the invention provides a semiconductor device of ESD, including a deep N-type region disposed in a substrate and a deep P-type region disposed in the substrate. Further, a first P-type well is disposed in the deep N-type region. A first N-type well abutting to the first P-type well is disposed in the deep N-type region. A second P-type well abutting to the first N-type well is disposed in the deep P-type region. A second N-type well abutting to the second P-type well is disposed in the deep P-type region. A side N-type well is disposed in the deep N-type region at an outer side of the first P-type well. A side P-type well is disposed in the deep P-type region at an outer side of the second N-type well.

In an embodiment, as to the semiconductor device of ESD protection, it further comprises a first heavily doped P-type region in the first P-type well, to also connect to the protected terminal. A first heavily doped N-type region is in the second N-type well, to serve as a ground terminal to receive the ground voltage. A second heavily doped P-type region is in the side P-type well to also receive the ground voltage. A second heavily doped N-type region is in the side N-type well.

In an embodiment, as to the semiconductor device of ESD protection, the deep P-type region is provided by a deep P-type well.

In an embodiment, as to the semiconductor device of ESD protection, the deep P-type region is provided by the substrate.

In an embodiment, as to the semiconductor device of ESD protection, the deep N-type region is provided by a deep N-type well in the substrate.

In an embodiment, the invention also provides a semiconductor device of electrostatic discharge protection, comprising: a first P-type well, disposed in a substrate, to receive a protected terminal and a first N-type well, abutting to the first P-type well, disposed in the substrate. Further, a second P-type well abutting to the first N-type well is disposed in the substrate. A second N-type well abutting to the second P-type well is disposed in the substrate. A first route structure is disposed in the substrate, on a sidewall and a bottom of the first P-type well, so as to connect to a bottom of the first N-type well. A second route structure is disposed in the substrate, on a sidewall and a bottom of the second N-type well, so as to connect to a bottom of the second P-type well.

In an embodiment, as to the semiconductor device of ESD protection, the second route structure receives a ground voltage and passes the ground voltage to the second P-type well.

In an embodiment, as to the semiconductor device of ESD protection, a portion of the second route structure at the bottom of the second N-type well is provided by a deep P-type well or the substrate by P-type.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to the semiconductor structure for an ESD device and the method for fabricating the ESD device. The ESD device is based on the SCR structure with doped stack of PNPN. The invention has modified the router of the PNPN then the voltage at the protected terminal is detected. When the detected voltage is equal to or larger than a trigger level, the ESD protection mechanism is triggered.

Multiple embodiments are provided for describing the invention but the invention is not just limited to the embodiments.

Figure 1:
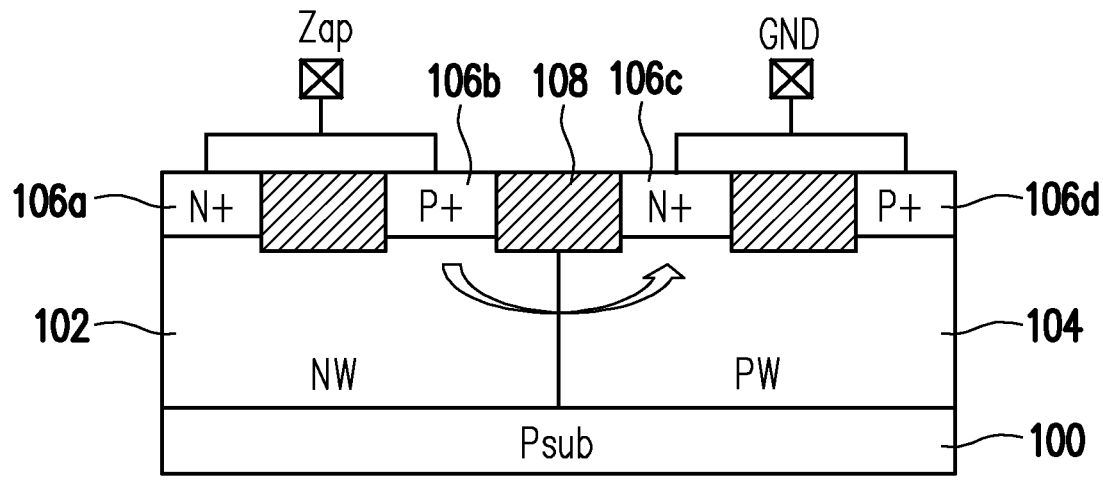
FIG. 1 is a drawing in cross-sectional view, schematically illustrating a structure of ESD device as being looked into, according to an embodiment of the invention.

FIG. 1 is a drawing in cross-sectional view, schematically illustrating a structure of ESD device as being looked into, according to an embodiment of the invention.

Referring to FIG. 1, a semiconductor structure for a SCR device serving as the ESD device is provided. Taking a P-type semiconductor substrate 100 such as silicon substrate as a structure base, the SCR structure is formed on the substrate 100, is preliminarily doped to have P-type conductivity for the substrate. The substrate 100 is then also indicated by Psub.

An N-type well 102, also indicated by NW, is formed in the substrate 100. A P-type well 104, also indicated by PW, abutting to the N-type well 102 is formed in the substrate 100. Surface contact regions 106a, 106b are further formed in the N-type well 102. The two contact regions 106a and 106b are respectively N-type and P-type with heavily dopant concentration, also indicated by N+ and P+. The contact regions 106a and 106b are isolated by isolation structure 108 therebetween. In addition, another two contact regions 106c and 106d are formed in the P-type well 104, respectively indicated by N+ and P+. The contact regions 106c and 106d are also isolated by isolation structure 108.

The contact regions 106a, 106b, 106c, 106d are used to connect to the terminals of external circuit in operation. For example, the contact regions 106a and 106b are commonly connected to a terminal, which receives the detected voltage Zap and is the terminal of the external circuit to be protected by the ESD device. The contact regions 106c and 106d are commonly connected to a ground terminal, as indicated by GND. Once the ESD to triggered, the route structure as indicated by arrow would flow through the contact region 106b, the N-type well 102, the P-type well 104 and the contact region 106c, which form a SCR structure of PNPN.

After looking into the ESD device based on SCR structure, although it has the ESD endurance, the trigger voltage is still high as at least observed in the invention, it causes the turning on speed to be insufficiently fast. The structure of ESD device in FIG. 1 may be further modified after looking into.

Figure 2:
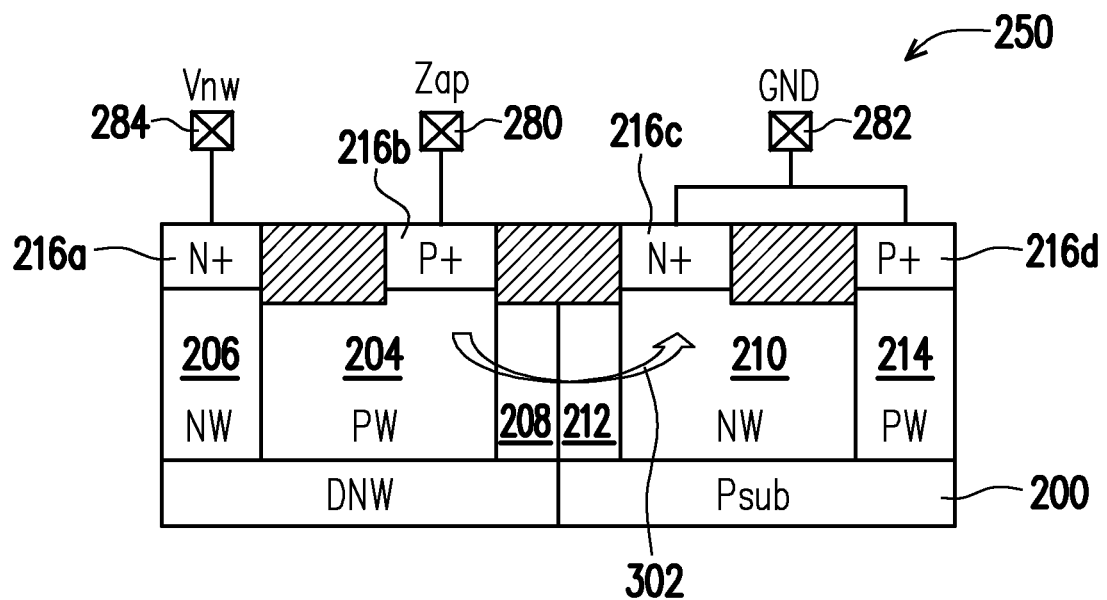
FIG. 2 is a drawing in cross-sectional view, schematically illustrating a structure of ESD device, according to an embodiment of the invention.

FIG. 2 is a drawing in cross-sectional view, schematically illustrating a structure of ESD device, according to an embodiment of the invention. Referring to FIG. 2, the invention then provides a semiconductor device of ESD protection. The semiconductor device of ESD protection may include a SCR device 250. In addition, the semiconductor device of ESD protection also include a detective circuit device as to be described later, so as to control the SCR device 250. FIG. 2 is about the SCR device 250. The SCR device 250 has a substrate 200 to serve as the structure base. The substrate 200 in an example is silicon substrate. The substrate 100 may have been preliminarily doped to have P-type substrate or be specifically doped to have a deep P-type region, as indicated Psub and also generally referred as a deep P-type region Psub. Additionally, a deep N-type region as indicated by DNW is also formed in the substrate abutting to the deep P-type region Psub.

Further, a first P-type well 204 is disposed in the deep N-type region DNW. A first N-type well 208 abutting to the first P-type well 204 is disposed in the deep N-type region DNW. In other words, the top portion of the deep N-type region DNW has been formed into the first N-type well 208 and the first P-type well 204.

Likewise, a second P-type well 212 abutting to the first N-type well 208 is disposed in the deep P-type region Psub of the substrate 200. A second N-type well 210 abutting to the second P-type well 212 is also disposed in the deep P-type region Psub.

As a result, the first P-type well 204, the first N-type well 208, the second P-type well 212 and the second N-type well 210 form a route structure 302 of PNPN as a basic part of the SCR device 250, which allows an ESD current to flow to the ground (GND) through the route structure 302 when the SCR device 250 is triggered.

In addition, the SCR device 250 includes a side N-type well 206 as also indicated by NW is disposed in the deep N-type region DNW at an outer side of the first P-type well 204. A side P-type well 214 as also indicated by PW is disposed in the deep P-type region Psub at an outer side of the second N-type well 210.

To apply the voltage to the first P-type well 204 and the second N-type well 210, the contact region 216b and the contact region 216c being heavily doped as indicted by P+ and N+ are formed in the corresponding doped wells. The contact region 216b would be connected to a connection terminal 280 and the contact region 216c would be connected to a connection terminal 282. To apply the operation voltages to the first N-type well 208 and the second P-type well 212, the invention additionally forms the routes to apply the corresponding voltages. Another contact region 216a and contact region 216d being heavily doped indicated by N+ and P+ are respectively formed in the substrate 200 within the side N-type well 206 and the side P-type well 214. As a result, a trigger voltage Vnw at a connection terminal 284 may be applied to the first N-type well 208 through the contact region 216a, the side N-type well 206 and the deep N-type region DNW. A ground voltage GND at the connection terminal 282 may be applied the second P-type well 212 through the contact region 216d, the side P-type well 214 and the deep P-type region Psub. The contact regions 216a, 216b, 216c, 216d are located at the surface region of the substrate 200 but isolated one another by isolation structures.

Figure 3:
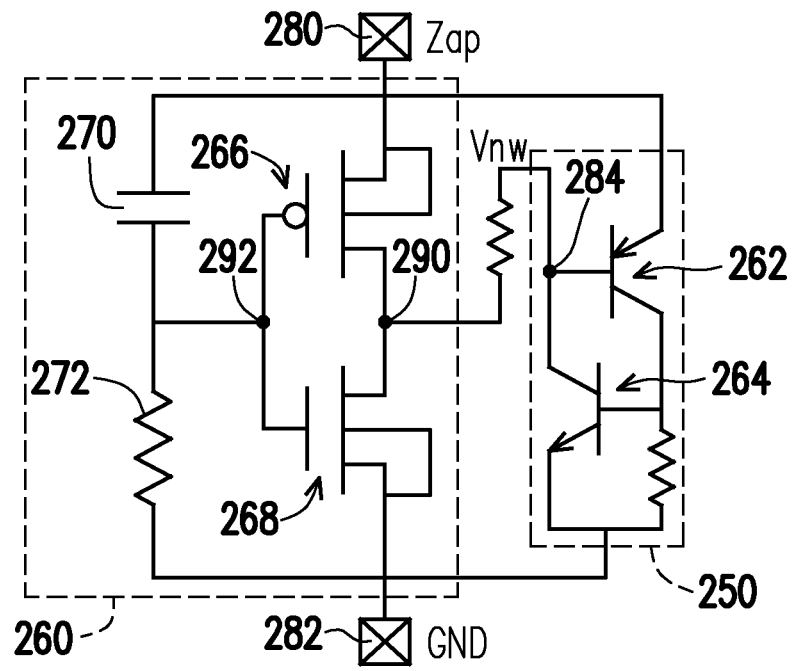
FIG. 3 is a circuit, schematically illustrating a circuit of ESD protection with detective circuit, according to an embodiment of the invention.

The ESD device of the invention also includes a detective circuit device formed on the substrate 200 and is connected to the SCR device 250 through the connection terminals 280, 282, 284. The detective circuit device would be described below. FIG. 3 is a circuit, schematically illustrating a circuit of ESD protection with detective circuit, according to an embodiment of the invention.

Referring to FIG. 3, the equivalent circuit structure of the SCR device 250 is shown. The SCR device 250 basically includes a PNP transistor 262 and an NPN transistor 264 with the connection terminals 280, 282, 284. The detective circuit device 260 is connected to the SCR device 250 to form the ESD device. Here, the semiconductor structure of the detective circuit device 260 is not actually shown in detail but the one with ordinary skill in the art may know how the detective circuit device circuit 260 is fabricated by the semiconductor fabrication technology.

The detective circuit device 260 as viewed from circuit includes an inverter, including a P-type metal-oxide-semiconductor (PMOS) transistor 266 and a N-type metal-oxide-semiconductor (NMOS) transistor 268 respectively coupled to a node 290, which is serving as the connection terminal 284 and is also serving as an output terminal of the inverter. A series connection between the connection terminal 280 and the connection terminal 282 is then formed. The connection terminal 280 as a protected terminal of the external circuit is to be protected from ESD current. The connection terminal 282 serves as a ground terminal to receive the ground voltage. The PMOS transistor 266 and the NMOS transistor 268 form an inverter. A resistor may be included at the connection terminal 284 as usually needed in the actual circuit but the invention is not limited to. The connection terminal 284 provides the trigger voltage Vnw to the SCR device 250. As noted, the connection terminal, that is the protected terminal, would receive the ESD current/voltage. However, the invention uses the detective circuit device 260 with the inverter mechanism to provide the trigger voltage Vnw to the SCR device 250. Additionally, the detective circuit device 260 also includes a route composed of a capacitor 270 and a resistor 272 coupled to another node 292, so that a series connection between the connection terminal 280 and the connection terminal 282 is formed. The input terminal of the inverter formed from the transistor 266 and 268 is also connected to the node 292.

In the embodiment, the voltage level at contact region 216a is dynamic changing according to the detected voltage Zap at contact region 216b, which receives the detected voltage Zap at the connection terminal 280. As a result, the trigger voltage may be fast induced.

Figure 4:
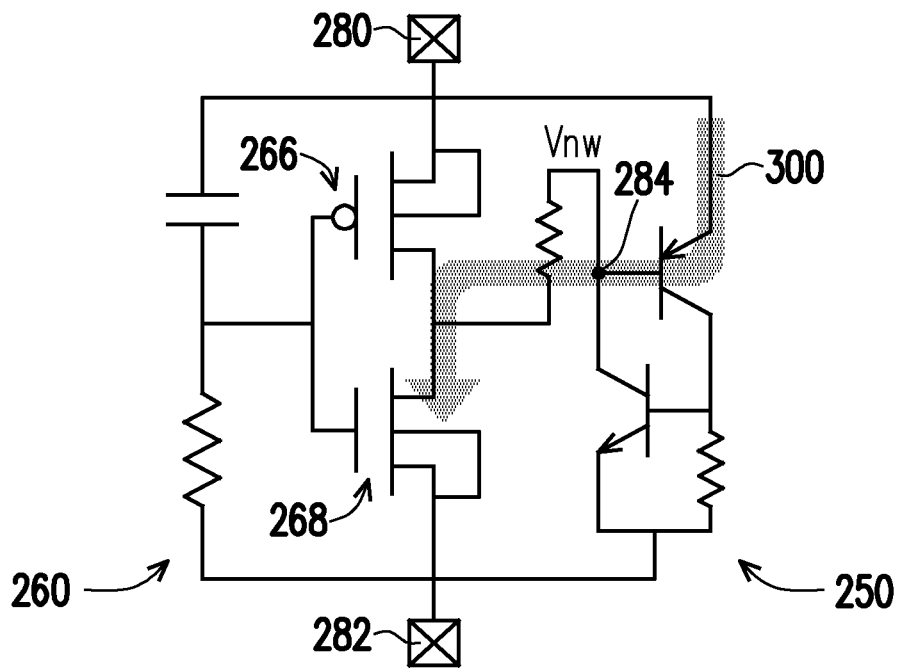
FIG. 4 is a circuit, schematically illustrating an operation mechanism for a circuit of ESD protection with detective circuit when the ESD device is not triggered yet, according to an embodiment of the invention.

FIG. 4 is a circuit, schematically illustrating an operation mechanism for a circuit of ESD protection with detective circuit when the ESD device is not triggered yet, according to an embodiment of the invention.

Referring to FIG. 4, as to the circuit of the ESD device in operation, the route structure 300 as indicated by arrow is corresponding to the situation that the SCR device 260 is not triggered. There is no ESD phenomenon at the usually state. The connection terminal 280 is for receiving the detected voltage Zap and the connection terminal 284 is for receiving the trigger voltage Vnw. The path between the connection terminal 280 and the connection terminal 284 is similar to a diode path, in which the trigger voltage Vnw is not reaching to the trigger level and the SCR protection mechanism is not trigged yet.

Figure 5:
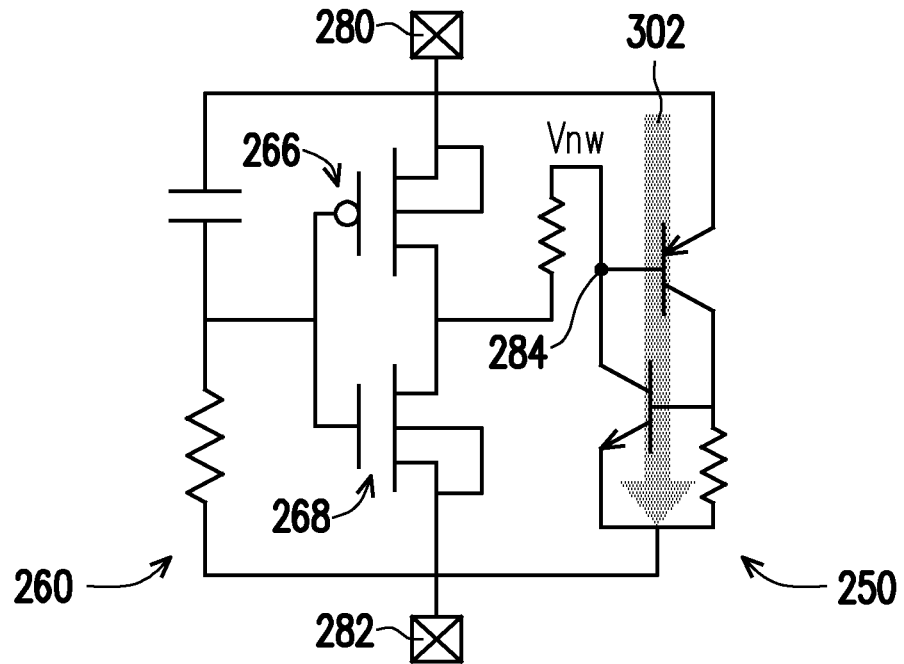
FIG. 5 is a circuit, schematically illustrating an operation mechanism for a circuit of ESD protection with detective circuit when the ESD device is triggered, according to an embodiment of the invention.

FIG. 5 is a circuit, schematically illustrating an operation mechanism for a circuit of ESD protection with detective circuit when the ESD device is triggered, according to an embodiment of the invention.

Referring to FIG. 5, when the connection terminal 280, that is the protected terminal, may receive the ESD current/voltage. In this situation, the voltage at the connection terminal 280 would instantly rise up. However, a voltage level at the output terminal 284 of the detective circuit device 200 rises as well in accordance with the voltage level at the connection terminal 280. When the voltage level at the connection terminal 284 has reached to the trigger voltage Vnw, the SCR device 250 is triggered and then the ESD current would flow through the route structure 302.

Figure 6:
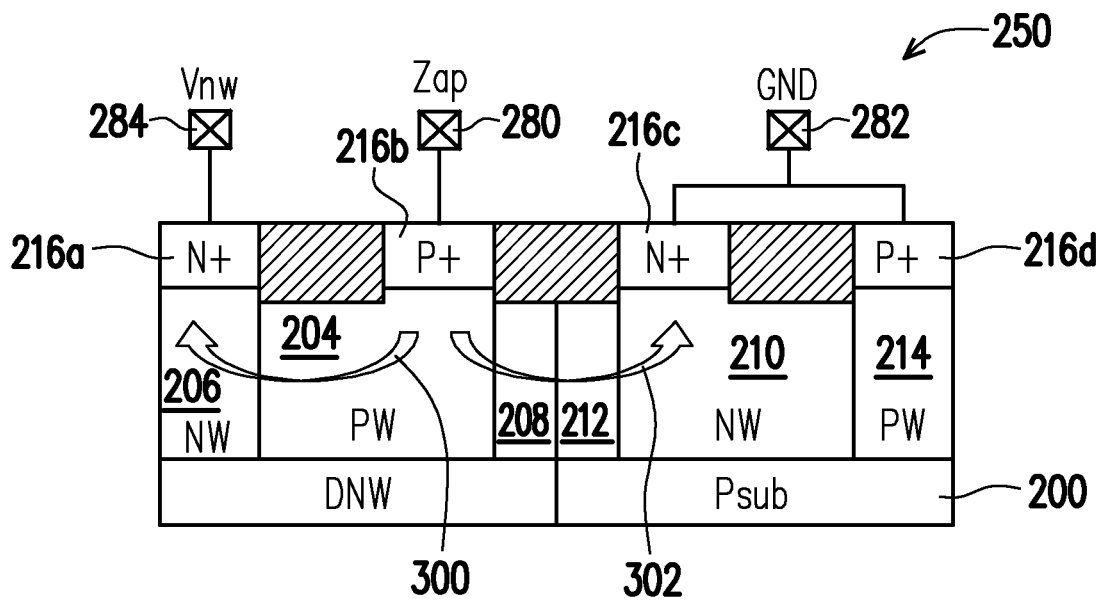
FIG. 6 is a circuit, schematically illustrating the current flow route in a circuit of ESD protection with detective circuit with respect to FIG. 4 and FIG. 5, according to an embodiment of the invention.

FIG. 6 is a circuit, schematically illustrating the current flow route in a circuit of ESD protection with detective circuit with respect to FIG. 4 and FIG. 5, according to an embodiment of the invention.

Referring to FIG. 6, as to the semiconductor structure of the SCR device 250, the route structure 300 corresponding to the circuit in FIG. 3 functions as a diode when the usual condition without involving the ESD current. The detected voltage Zap at the connection terminal 280 is received by the contact region 216b and then flows to the contact region 216a due to the diode formed from the first P-type well 204 and the side N-type well 206.

The route structure 302 corresponding to the circuit in FIG. 4 functions as a discharging path when the ESD current/voltage enters the connection terminal 280. The voltage level at the connection terminal 284 in the detective circuit device 260 would rise up to the trigger voltage Vnw if the ESD phenomenon occurs. The trigger voltage Vnw is transferred to the first N-type well 208 to trigger the route structure 302, realized as a PNPN path in the SCR device 250 through the first P-type well 204, the first N-type well 208, the second P-type well 212, and the second N-type well 210. The contact region 216c and the contact region 216d in an embodiment are both connected to the connection terminal 282, which is the ground voltage GND.

In the invention, the trigger voltage Vnw in dynamic changing is transferred to first N-type well 208 by the route of the contact region 216a, the side N-type well 206, and the deep N-type region DNW. The ground voltage at the connection terminal 282 is also applied to the second P-type well 212 through the contact region 216d, the side P-type well 214 and the deep P-type region Psub.

In other words, the voltage level of at contact region 216a is dynamic changing according to the detected voltage Zap at contact region 216b, which receives the detected voltage Zap at the connection terminal 280. Once the ESD current occurs, the detected voltage Zap rise quickly. The voltage level of at contact region 216a fast rises accordingly and reaches to the trigger voltage Vnw. As a result, the trigger voltage Vnw fast trigger the SCR path.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device of electrostatic discharge (ESD) protection, comprising:
  a deep N-type region, disposed in a substrate;
  a deep P-type region, disposed in the substrate;
  a first P-type well, disposed in the deep N-type region;
  a first N-type well, abutting to the first P-type well, disposed in the deep N-type region;
  a second P-type well, abutting to the first N-type well, disposed in the deep P-type region;
  a second N-type well, abutting to the second P-type well, disposed in the deep P-type region;
  a side N-type well, disposed in the deep N-type region at an outer side of the first P-type well; and
  a side P-type well, disposed in the deep P-type region at an outer side of the second N-type well.

2. The semiconductor device of ESD protection of claim 1, further comprising:

a first heavily doped P-type region in the first P-type well to also connect to the protected terminal;
a first heavily doped N-type region in the second N-type well to serve as a ground terminal to receive the ground voltage;
a second heavily doped P-type region in the side P-type well to also receive the ground voltage; and
a second heavily doped N-type region in the side N-type well.

3. The semiconductor device of ESD protection of claim 1, wherein the deep P-type region is provided by a deep P-type well.

4. The semiconductor device of ESD protection of claim 1, wherein the deep P-type region is provided by the substrate.

5. The semiconductor device of ESD protection of claim 1, wherein the deep N-type region is provided by a deep N-type well in the substrate.

6. A semiconductor device of electrostatic discharge (ESD) protection, comprising:
a first P-type well, disposed in a substrate, to receive a protected terminal;
a first N-type well, abutting to the first P-type well, disposed in the substrate;
a second P-type well, abutting to the first N-type well, disposed in the substrate;
a second N-type well, abutting to the second P-type well, disposed in the substrate;
a first route structure, disposed in the substrate, on a sidewall and a bottom of the first P-type well, so as to connect to a bottom of the first N-type well; and
a second route structure, disposed in the substrate, on a sidewall and a bottom of the second N-type well, so as to connect to a bottom of the second P-type well.

7. The semiconductor device of ESD protection of claim 6, wherein the second route structure receives a ground voltage and passes the ground voltage to the second P-type well.

8. The semiconductor device of ESD protection of claim 6, wherein a portion of the second route structure at the bottom of the second N-type well is provided by a deep P-type well or the substrate by P-type.

* * * * *